United States Patent
Narathong et al.

(10) Patent No.: US 7,379,522 B2
(45) Date of Patent: May 27, 2008

(54) CONFIGURABLE MULTI-MODULUS FREQUENCY DIVIDER FOR MULTI-MODE MOBILE COMMUNICATION DEVICES

(75) Inventors: Chiewcharn Narathong, Laguna Niguel, CA (US); Wenjun Su, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 148 days.

(21) Appl. No.: 11/472,824

(22) Filed: Jun. 21, 2006

(65) Prior Publication Data

US 2007/0160179 A1 Jul. 12, 2007

Related U.S. Application Data

(60) Provisional application No. 60/758,465, filed on Jan. 11, 2006.

(51) Int. Cl.
*H03K 21/00* (2006.01)
*H03K 23/00* (2006.01)

(52) U.S. Cl. .......................... 377/47; 377/48
(58) Field of Classification Search .................. 377/47, 377/48
See application file for complete search history.

(56) References Cited

U.S. PATENT DOCUMENTS

| | | | |
|---|---|---|---|
| 4,851,787 A | 7/1989 | Martin | |
| 6,031,425 A | 2/2000 | Hasegawa | |
| 6,501,816 B1 * | 12/2002 | Kouznetsov et al. | 377/48 |
| 6,559,726 B1 * | 5/2003 | Stansell | 331/16 |
| 6,834,094 B1 | 12/2004 | Liu et al. | |
| 6,888,913 B2 | 5/2005 | Walker | 377/47 |
| 2002/0186808 A1 | 12/2002 | Kouznetsov et al. | |
| 2003/0108143 A1 * | 6/2003 | Han et al. | 377/47 |
| 2005/0180539 A1 * | 8/2005 | De Gouy et al. | 377/47 |

FOREIGN PATENT DOCUMENTS

| | | |
|---|---|---|
| EP | 1 294 100 A | 3/2003 |
| FR | 2 769 432 A1 | 4/1999 |

* cited by examiner

*Primary Examiner*—Tuan T. Lam
(74) *Attorney, Agent, or Firm*—Howard Seo; Stanton Braden; Thomas R. Rouse

(57) ABSTRACT

Within a mobile communication device (for example, a cellular telephone), there is a local oscillator. The local oscillator includes a novel frequency divider that includes a novel configurable multi-modulus divider (CMMD). The frequency divider is configurable into a selectable one of multiple configurations involving different mixes of synchronous and asynchronous circuitry. In each configuration, the frequency divider produces an amount of noise and consumes an amount of power. Power consumption is loosely inversely related to noise produced in that the modes with the highest power consumption produce the least amount of noise, and vice versa. The mobile communication device is operable in one of multiple different communication standards (for example, GSM, CDMA1X and WCDMA). The different communication standards impose different noise requirements on the frequency divider. By using the lowest power configuration that satisfies the noise requirements of the standard being used, power consumption of the cellular telephone is reduced.

22 Claims, 14 Drawing Sheets

GSM MODE
DIVIDE BY 180.2

GSM MODE
DIVIDE BY 180.2

BUFFER

DIV-BY-2

DIV-BY-4

OUTPUT STAGE

| INPUTS | | OUTPUTS TO SEVEN DIVIDER STAGES | | | | | | | OUTPUTS TO CONFIGURATION INPUTS OF DIVIDER | | | |
|---|---|---|---|---|---|---|---|---|---|---|---|---|
| SEL[1] | SEL[0] | ST[6] | ST[5] | ST[4] | ST[3] | ST[2] | ST[1] | ST[0] | C0 | C1 | C2 | MODE |
| 0 | 0 | S[6] | S[5] | S[4] | S[3] | S[2] | S[1] | S[0] | 0 | 0 | 0 | GSM |
| 0 | 1 | S[5] | S[4] | S[3] | S[2] | S[1] | S[0] | S[0] | 1 | 1 | 0 | CDMA1X |
| 1 | 0 | S[4] | S[3] | S[2] | S[1] | S[0] | S[1] | S[0] | 1 | 0 | 1 | WCDMA |

CONTROL LOGIC

FIG. 9

| INPUTS | | OUTPUTS TO ADDER | | | | | | | | OUTPUTS TO SHIFT RIGHT FRACTIONAL | | |
|---|---|---|---|---|---|---|---|---|---|---|---|---|
| SEL[1] | SEL[0] | NT[7] | NT[6] | NT[5] | NT[4] | NT[3] | NT[2] | NT[1] | NT[0] | N_IN1 | N_IN2 | MODE |
| 0 | 0 | N[7] | N[6] | N[5] | N[4] | N[3] | N[2] | N[1] | N[0] | 0 | 0 | GSM |
| 0 | 1 | 0 | N[7] | N[6] | N[5] | N[4] | N[3] | N[2] | N[1] | N[0] | 0 | CDMA1X |
| 1 | 0 | 0 | 0 | N[7] | N[6] | N[5] | N[4] | N[3] | N[2] | N[1] | N[0] | WCDMA |

SHIFT RIGHT INTEGER

FIG. 10

| INPUTS | | OUTPUT AS FT[21:0] TO SIGMA DELTA | | | | | | | | | | |
|---|---|---|---|---|---|---|---|---|---|---|---|---|
| SEL[1] | SEL[0] | [21] | [20] | [19] | [18] | ... | [5] | [4] | [3] | [2] | [1] | [0] | MODE |
| 0 | 0 | N[21] | N[20] | N[19] | N[18] | ... | N[5] | N[4] | N[3] | N[2] | N[1] | N[0] | GSM |
| 0 | 1 | N_IN1 | N[21] | N[20] | N[19] | ... | N[6] | N[5] | N[4] | N[3] | N[2] | N[1] | CDMA1X |
| 1 | 0 | N_IN1 | N_IN2 | N[21] | N[20] | ... | N[7] | N[6] | N[5] | N[4] | N[3] | N[2] | WCDMA |

SHIFT RIGHT FRACTIONAL

FIG. 11

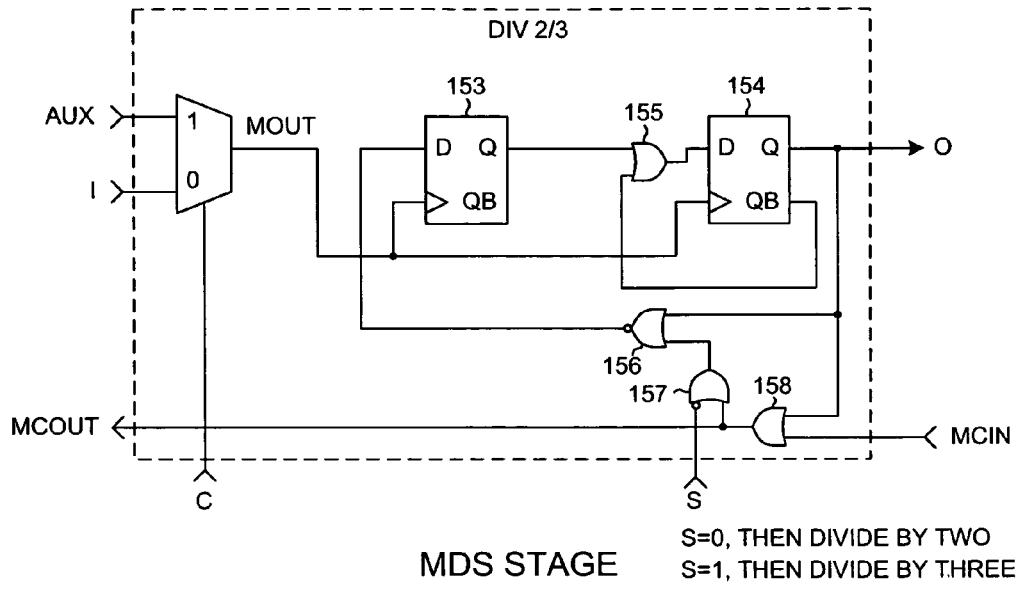

MDS STAGE

S=0, THEN DIVIDE BY TWO
S=1, THEN DIVIDE BY THREE

FIG. 12

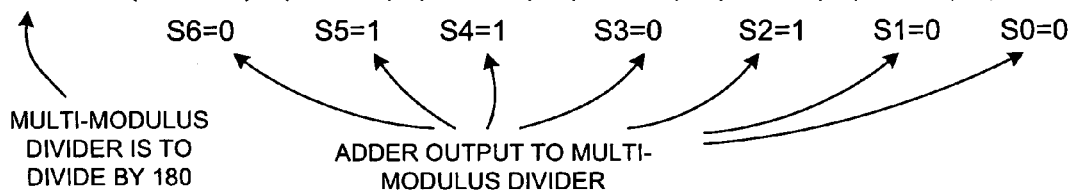

$180 = 128 + 52$ $180 = 128 + (S6 * 2^6) + (S5 * 2^5) + (S4 * 2^4) + (S3 * 2^3) + (S2 * 2^2) + (S1 * 2^1) + (S0 * 2^0)$ $S6=0 \quad S5=1 \quad S4=1 \quad S3=0 \quad S2=1 \quad S1=0 \quad S0=0$

MULTI-MODULUS DIVIDER IS TO DIVIDE BY 180

ADDER OUTPUT TO MULTI-MODULUS DIVIDER

EQUATION FOR SEVEN-STAGE MODULUS DIVIDER

FIG. 13

$$\frac{X}{2^{22}} = 0.2$$

NUMBER OF BITS OF SIGMA DELTA MODULATOR

FRACTIONAL PORTION OF DIVISOR

INTEGER PORTION SUPPLIED TO SIGMA DELTA MODULATOR

FIG. 15

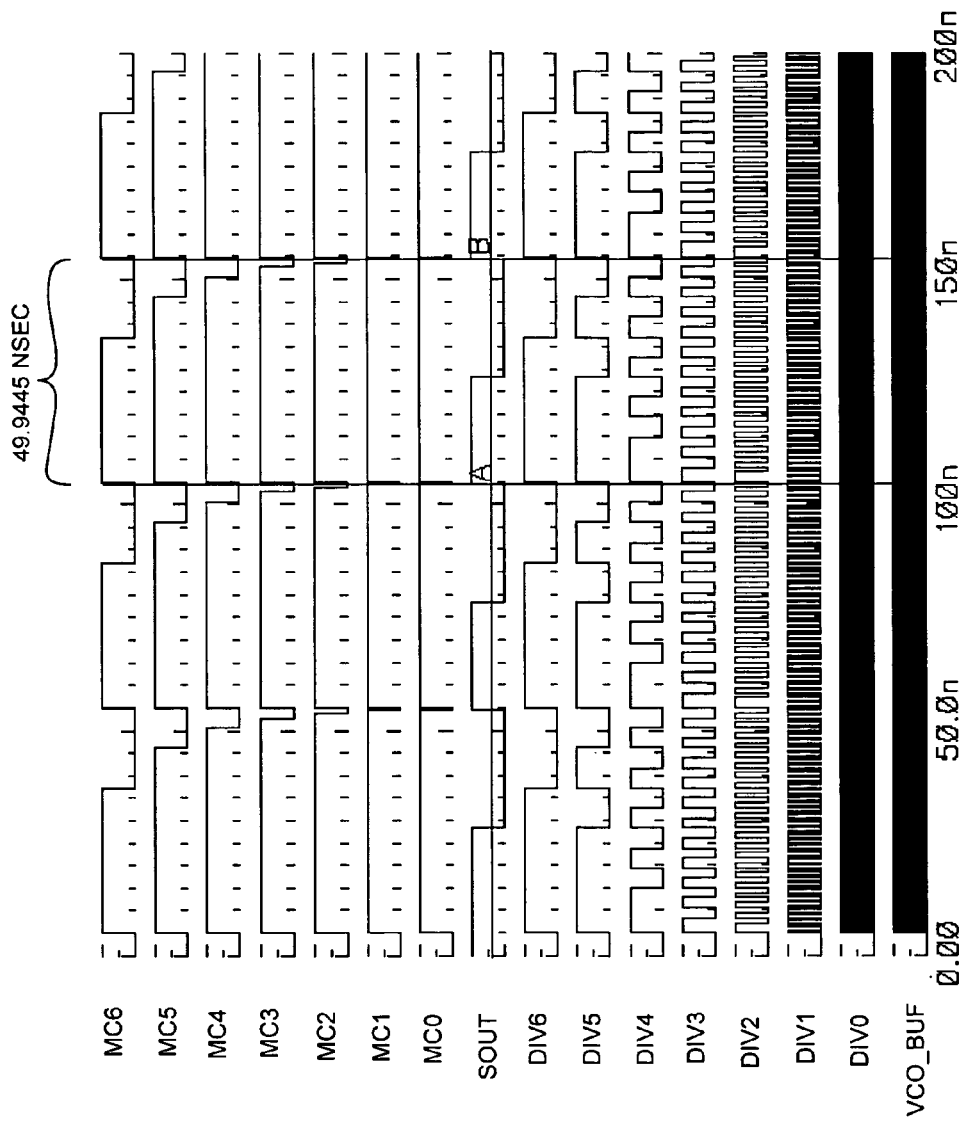

CDMA1X MODE
DIVIDE BY 180.2

$X = 64 + (S5 * 2^5) + (S4 * 2^4) + (S3 * 2^3) + (S2 * 2^2) + (S1 * 2^1) + (S0 * 2^0)$ $90 = 64 + 26$ $90 = 64 + (S5 * 2^5) + (S4 * 2^4) + (S3 * 2^3) + (S2 * 2^2) + (S1 * 2^1) + (S0 * 2^0)$

S5=0  S4=1  S3=1  S2=0  S1=1  S0=0

MULTI-MODULUS DIVIDER IS TO DIVIDE BY 90

ADDER OUTPUT TO MULTI-MODULUS DIVIDER

EQUATION FOR SIX-STAGE MODULUS DIVIDER

WHEN NOT DIVIDING BY THREE, DISABLE FIRST FLIP-FLOP AND PREVENT IT FROM CONSUMING POWER

S=0, THEN DIVIDE BY TWO
S=1, THEN DIVIDE BY THREE

MDS STAGE

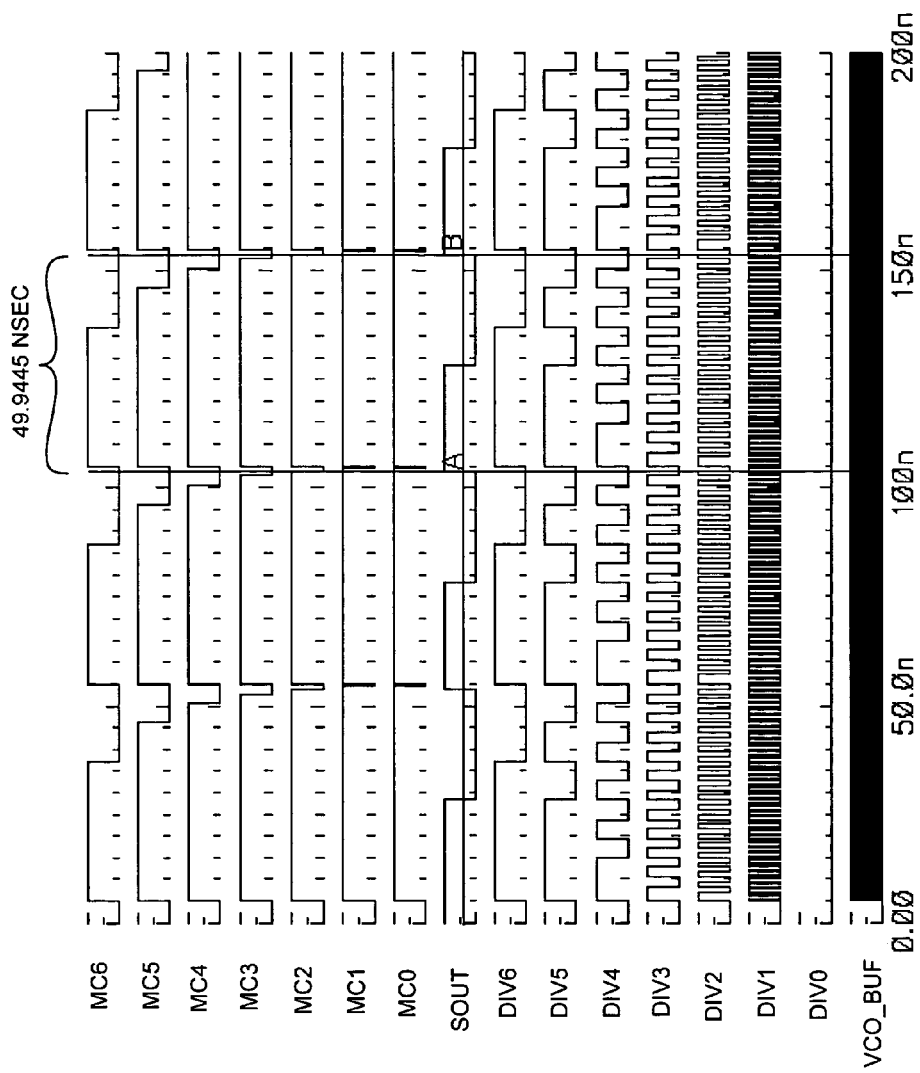

INTEGER=180, FT[0:21]=0, FIN=3.604GHZ, FOUT=1/49.9445NSEC, MODE=WCDMA

| | PRIOR ART MULTI-MODULUS DIVIDER | NOVEL CONFIGURABLE MULTI-MODULUS DIVIDER (CMMD) (FIG. 3) |
|---|---|---|
| NOISE IN GSM MODE | <-133 DBC/HZ AT 1 KHZ OFFSET | <-133 DBC/HZ AT 1 KHZ OFFSET |
| GSM NOISE REQUIREMENT | <-133 DBC/HZ AT 1 KHZ OFFSET | <-133 DBC/HZ AT 1 KHZ OFFSET |
| POWER IN GSM MODE | 26MA WITH 2.6V POWER SUPPLY | 26MA WITH 2.6V POWER SUPPLY |
| CDMA1X NOISE REQUIREMENT | <-123 DBC/HZ AT 1 KHZ OFFSET | <-123 DBC/HZ AT 1 KHZ OFFSET |
| NOISE IN CDMA1X MODE | <-133 DBC/HZ AT 1 KHZ OFFSET | <-123 DBC/HZ AT 1 KHZ OFFSET |
| POWER IN CDMA1X MODE | 26MA WITH 2.6V POWER SUPPLY | 21MA WITH 2.6V POWER SUPPLY |
| WCDMA NOISE REQUIREMENT | <-123 DBC/HZ AT 1 KHZ OFFSET | <-123 DBC/HZ AT 1 KHZ OFFSET |
| NOISE IN WCDMA MODE | <-133 DBC/HZ AT 1 KHZ OFFSET | <-123 DBC/HZ AT 1 KHZ OFFSET |
| POWER IN WCDMA MODE | 26MA WITH 2.6V POWER SUPPLY | 16MA WITH 2.6V POWER SUPPLY |

PERFORMANCE COMPARISON

FIG. 23

CONFIGURABLE MULTI-MODULUS FREQUENCY DIVIDER FOR MULTI-MODE MOBILE COMMUNICATION DEVICES

CROSS-REFERENCE TO RELATED APPLICATION

This application claims the benefit under 35 U.S.C. §119 of Provisional Application Ser. No. 60/758,465, filed Jan. 11, 2006, said provisional application is incorporated herein by reference.

BACKGROUND INFORMATION

1. Technical Field

The disclosed embodiments relate to local oscillators for use in multi-mode mobile communication devices.

2. Description of Related Art

The receiver and transmitter circuitry within a cellular telephone typically include one or more local oscillators. The function of a local oscillator is to output a signal of a selected frequency. Such a local oscillator in a cellular telephone may, for example, include a phase-locked loop (PLL) that receives a stable but relatively low frequency signal (for example, 20 MHz) from a crystal oscillator and generates the output signal of the selected relatively high frequency (for example, 900 MHz). The feedback loop of the PLL includes a frequency divider that receives the high frequency signal and divides it down to obtain a low frequency signal that is of the same phase and frequency as the signal from the crystal oscillator. A type of divider referred to here a "multi-modulus divider" is often used to realize the frequency divider. Due to the high frequency operation of the frequency divider, the frequency divider may consume an undesirably large amount of power. Techniques and methods for reducing the amount of power consumed by the frequency dividers in the local oscillators are desired.

SUMMARY

Within a mobile communication device (for example, a cellular telephone), there is a local oscillator. The local oscillator includes a novel frequency divider that in turn includes a novel configurable multi-modulus divider (CMMD). The frequency divider is configurable into a selectable one of multiple configurations. Each configuration involves a different mix of synchronous and asynchronous circuitry. In each configuration, the frequency divider produces an amount of noise and consumes an amount of power. There is a loose inverse relationship between the power consumption of a frequency divider configuration of the novel frequency divider, and noise produced by the novel frequency divider when the novel frequency divider is operating in the configuration. Accordingly, the higher the power consumption of a configuration, the less noise is produced by the configuration.

The mobile communication device is operable so that it can communicate using a selectable one of multiple different communication standards (for example, GSM, CDMA1X and WCDMA). The different communication standards impose different noise requirements on the frequency divider in the local oscillator of the mobile communication device. By configuring the frequency divider into the lowest power configuration that still satisfies the noise requirements of the standard being used, power consumption of the cellular telephone is reduced.

In one embodiment, the frequency divider includes a fixed prescaler and a plurality of modulus divider stages (MDS stages). In a first higher-power but lower-noise operating mode, the prescaler and MDS stages are configured to form an N-stage multi-modulus divider. The N-stage multi-modulus divider receives the frequency divider input signal SIN and divides it by a divisor value DV to generate an frequency divider output signal SOUT. A sigma-delta modulator (sometimes called a delta-sigma modulator) dynamically changes the DV value such that over a time period spanning multiple count cycles, the frequency divider divides by an overall desired divisor D. The fixed prescaler is disabled, is not used and consumes no significant power.

In a second lower-power but higher-noise operating mode, the prescaler and MDS stages are configured to form a fixed divide-by-$2^X$ prescaler whose signal output is divided by a multi-modulus divider of N-X MDS stages. A number X of the MDS stages that were used as part of the N-stage multi-modulus divider in the first operating mode are not used in the N-X stage multi-modulus divider in the second operating mode. The unused MDS stages are disabled, unpowered, or are otherwise made to consume little or no power. The combination of the fixed prescaler and the N-X stage multi-modulus divider in the second operating mode operate to divide the frequency divider input signal SIN by the divisor value DV to generate the frequency divider output signal SOUT. The sigma-delta modulator dynamically changes the DV value such that over a time period spanning multiple count cycles, the frequency divider divides by an overall desired divisor D.

Regardless of whether the frequency divider is configured to operate in the first operating mode or the second operating mode, the frequency divider can receive a frequency divider input signal SIN of frequency F1 on an input lead (or leads), frequency divide the input signal by the divisor D, and output a frequency divider output signal SOUT of frequency F2 onto an output lead (or leads), where F1/D equals F2 over the time period spanning multiple multi-modulus divider count cycles. The divisor D has an integer portion and a fractional portion. The fractional portion can be a non-zero value.

In one novel aspect, a method involves the following steps (a)-(c): (a) selecting either a first operating mode of a configurable frequency divider or a second operating mode of the configurable frequency divider, where the configurable frequency divider includes a prescaler and a plurality of modulus divider stages. (b) frequency dividing an input signal using an N-stage multi-modulus divider if the first operating mode was selected in step (a). The N-stage multi-modulus divider includes a number N of the plurality of modulus divider stages; and (c) frequency dividing the input signal using the prescaler and an M-stage multi-modulus divider if the second operating mode was selected in step (a). The prescaler, in the second operating mode, outputs a prescaler output signal such that the prescaler output signal is divided by the M-stage multi-modulus divider, such that the M-stage multi-modulus divider includes a number M of modulus divider stages, and such that the M modulus divider stages are a subset of the N modulus divider stages.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 9 is a table that sets forth the operation of the control logic circuit within the frequency divider of FIG. 3.

FIG. 10 is a table that sets forth the operation of the shift right integer (SRI) circuit within the frequency divider of FIG. 3.

FIG. 11 is a table that sets forth the operation of the shift right fractional (SRF) circuit within the frequency divider of FIG. 3.

FIG. 12 is a detailed diagram of one of the MDS stages of the CMMD of FIG. 4.

FIG. 13 sets forth an equation that indicates what the value of S[6:0] should be in order for a seven-stage multi-modulus divider to divide by a desired divisor number.

FIGS. 14 and 15 set forth how the value F[21:0] (that is supplied to shift right fractional (SRF) circuit) is determined so that the sigma-delta modulator of the frequency divider of FIG. 3 will output a stream of values DSM[3:0] that will cause the frequency divider to divide by a divisor D having a particular fractional portion.

FIG. 16 is a waveform diagram showing signals within the CMMD of the frequency divider of FIG. 3 when the mobile communication device of FIG. 1 is operating in the GSM mode.

FIG. 20 is a waveform diagram showing signals within the CMMD of the frequency divider of FIG. 17 when the mobile communication device of FIG. 1 is operating in the CDMA1X mode.

FIG. 23 is a table that compares the performance (power consumption and noise produced) of a conventional multi-modulus divider to the performance of the novel configurable multi-modulus divider (CMMD) of FIG. 3 in various operating modes.

DETAILED DESCRIPTION

Figure 1:
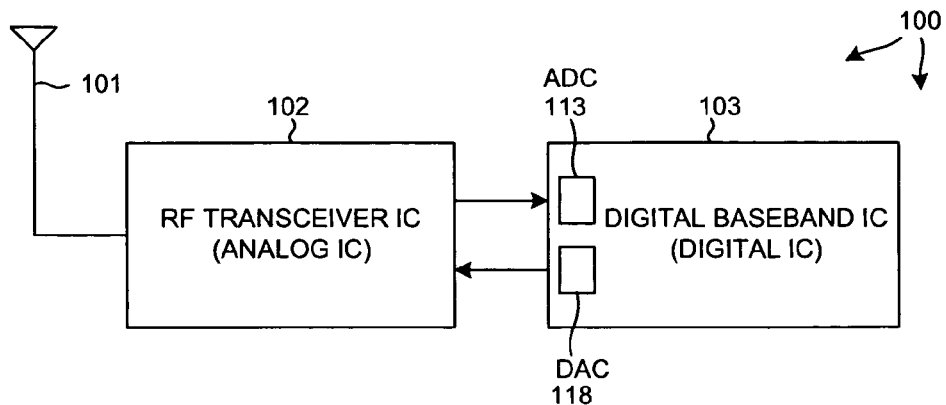
FIG. 1 is a simplified diagram of a mobile communication device (in this example, a cellular telephone) in accordance with one novel aspect.

FIG. 1 is a simplified diagram of a mobile communication device 100 in accordance with one novel aspect. Mobile communication device 100 in this case is a cellular telephone. The cellular telephone is able to communicate using a selectable one of multiple different cellular telephone standards. The cellular telephone can communicate using one standard, and then switch and begin communicating using another standard. Each of the standards places different spurious noise, phase noise and frequency resolution requirements on the local oscillators (LO) in the receiver and transmitter. In the example of FIG. 1, cellular telephone 100 is able to communicate in a selectable one of three cellular telephone standards: GSM (the Global System for Mobile Communications standard, CDMA1X (Code-Division Multiple Access 1X) and WCDMA (Wide-Band Code-Division Multiple Access). Cellular telephone 100 includes an antenna 101 and several integrated circuits including a novel radio frequency (RF) transceiver integrated circuit 102 and a digital baseband integrated circuit 103. Digital baseband integrated circuit 103 includes primarily digital circuitry and includes a digital processor. An example of digital baseband integrated circuit 103 is the MSM6280 available from Qualcomm Inc. Novel RF transceiver integrated circuit 102 includes circuits for processing analog signals.

Figure 2:
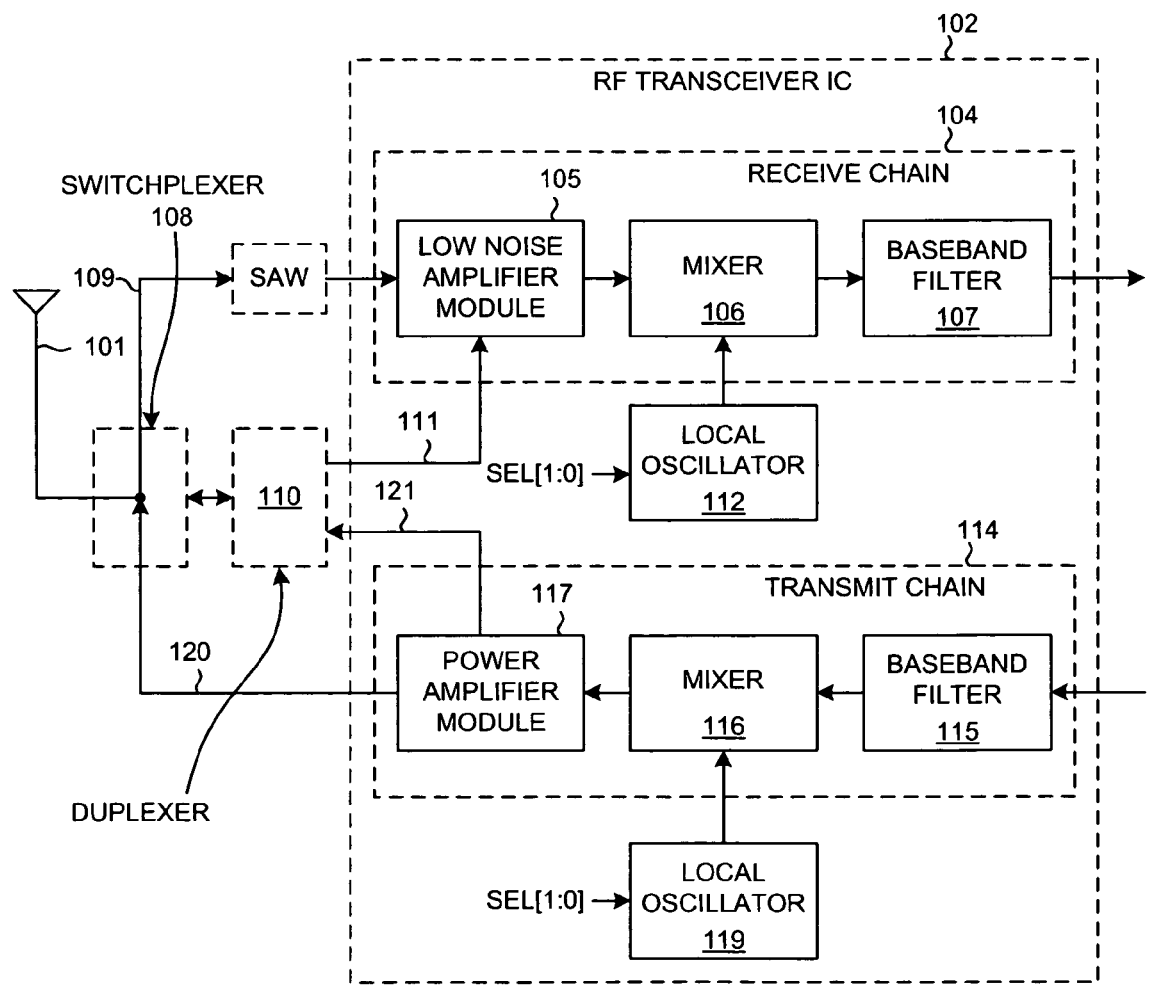
FIG. 2 is a diagram of the RF transceiver integrated circuit within the mobile communication device of FIG. 1.

FIG. 2 is a more detailed diagram of novel RF transceiver integrated circuit 102. The receiver "signal chain" 104 includes a low noise amplifier (LNA) module 105, a mixer 106, and a baseband filter 107. When receiving in the GSM mode, a signal on antenna 101 passes through a switchplexer 108 and then through path 109, through a SAW and into LNA 105. When receiving in the CDMA1X and WCDMA modes, a signal on antenna 101 passes through switchplexer 108, through a duplexer 110, and through path 111 and into LNA 105. In all modes, LNA 105 amplifies the high frequency signal. Local oscillator (LO) 112 supplies a local oscillator signal of an appropriate frequency to mixer 106 so that the receiver is tuned to receive signals of the proper frequency. Mixer 106 demodulates the high frequency signal down to a low frequency signal. Unwanted high frequency noise is filtered out by baseband filter 107. The analog output of baseband filter 107 is supplied to an analog-to-digital converter (ADC) 113 in the digital baseband integrated circuit 103. ADC 113 digitizes the analog signal into digital information that is then processed further by a digital processor in the digital baseband integrated circuit 103.

The transmitter "signal chain" 114 includes a baseband filter 115, a mixer 116 and a power amplifier module 117. Digital information to be transmitted is converted into an analog signal by digital-to-analog converter (DAC) 118 within digital baseband integrated circuit 103. The resulting analog signal is supplied to baseband filter 115 within the RF transceiver integrated circuit 102. Baseband filter 115 filters out unwanted high frequency noise. Mixer 116 modulates the output of baseband filter 115 onto a high frequency carrier. Local oscillator (LO) 119 supplies a local oscillator signal to mixer 116 so that the high frequency carrier has the correct frequency for the channel being used. The high frequency output of mixer 116 is then amplified by power amplifier module 117. When transmitting in the GSM mode, power amplifier module 117 outputs the signal via path 120, through switchplexer 108, and onto antenna 101. When transmitting in the CDMA1X and WCDMA modes, power amplifier module 117 outputs the signal via path 121 to duplexer 110. The signal passes through duplexer 110, through switchplexer 108, and to antenna 101. The use of duplexer 110 and switchplexer 108 that allow both for non-duplex (for example, GSM) and for duplex (for example, CDMA1X) communication is conventional. The particular circuit of FIG. 2 is just one possible implementation that is presented here for illustrative purposes.

Figure 3:
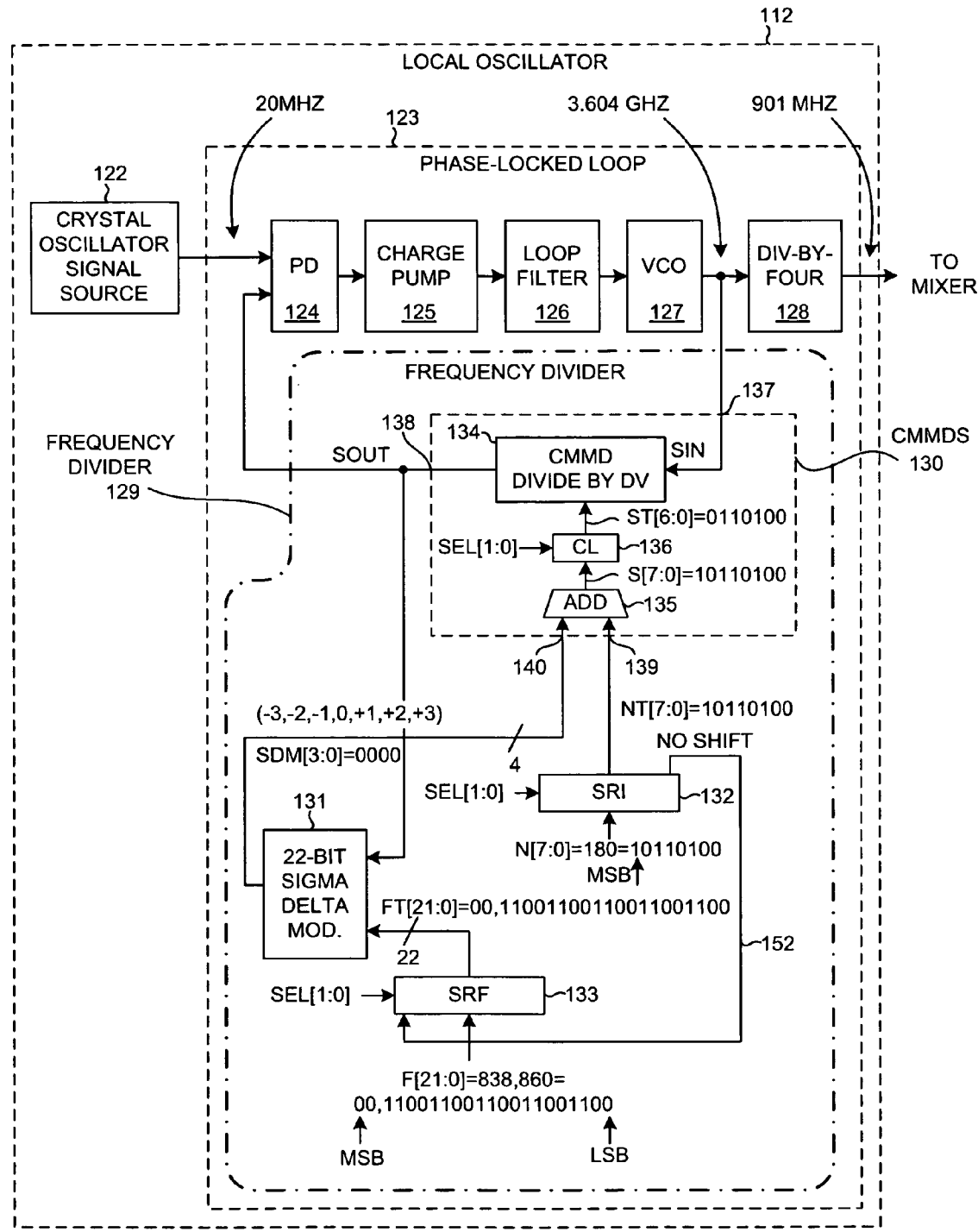
FIG. 3 is a diagram of a local oscillator in the RF transceiver integrated circuit of FIG. 2. The local oscillator includes a frequency divider operating in a GSM mode.

Operation of local oscillators 112 and 119 is explained below in connection with operation of local oscillator (LO) 112 in the receiver. FIG. 3 is a more detailed diagram of local oscillator 112. Local oscillator 112 includes a crystal oscillator signal source 122 and a fractional-N phase-locked loop (PLL) 123. In the present example, the crystal oscillator signal source 122 is a connection to an external crystal oscillator module. Alternatively, the crystal oscillator signal source is an oscillator disposed on RF transceiver integrated circuit 102, where the crystal is external to integrated circuit 102 but is attached to the oscillator via terminals of the integrated circuit 102.

PLL 123 includes a phase-detector (PD) 124, a charge pump 125, a loop filter 126, a voltage controlled oscillator (VCO) 127, a signal conditioning output divider 128, and a novel frequency divider 129 (sometimes called a "loop divider"). Frequency divider 129 receives a frequency divider input signal SIN of a first higher frequency F1, frequency divides the signal by a divisor D, and outputs a frequency divider output signal SOUT of a second lower frequency F2. Over a plurality of count cycles of frequency divider 129, F2=F1/D when the PLL is locked. When locked, the frequency F2 and phase of the SOUT signal matches the frequency and phase of the reference clock signal supplied from crystal oscillator signal source 122.

Frequency divider 129 includes a novel "configurable multi-modulus divider structure" (CMMDS) portion 130, a sigma-delta modulator portion 131, a shift right integer (SRI) circuit 132 and a shift right fractional (SRF) circuit 133. CMMDS portion 130 includes a novel configurable multi-modulus divider (CMMD) 134, an adder 135, and a control logic (CL) circuit 136. CMMDS 130 divides the frequency divider input signal SIN on input node(s) 137 by a value DV in a count cycle and generates the frequency divider output signal SOUT on output node(s) 138. Although node 137 is illustrated as a single line, the node in this embodiment includes two conductors and carries a differential signal. CMMDS 130 also has a first digital input port 139 and a second digital input port 140. The value DV is the sum of a first digital value on first digital input port 139 and a second digital value on second digital input port 140.

Figure 4:
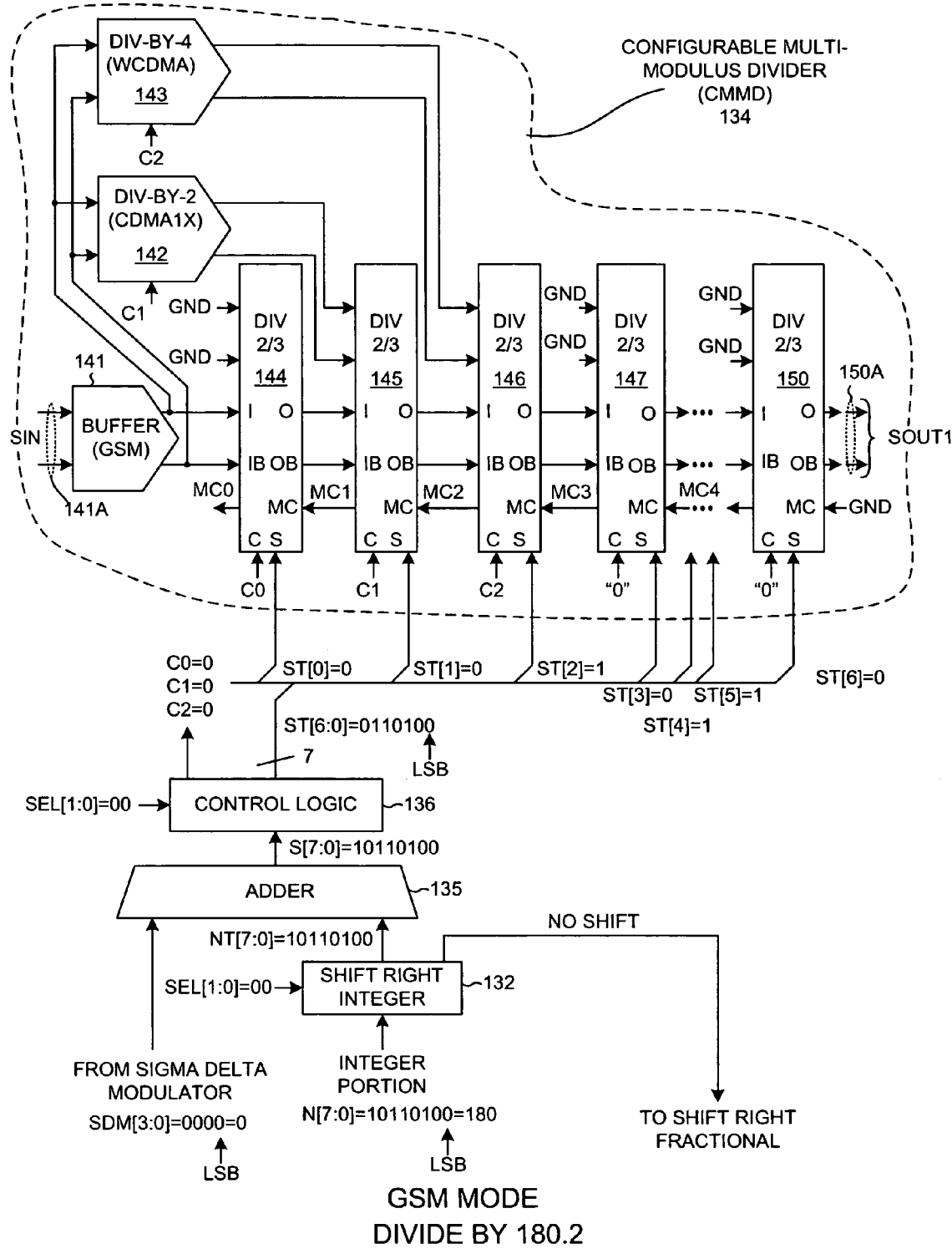
FIG. 4 is a diagram of a configurable multi-modulus divider (CMMD) in the frequency divider of FIG. 3.

FIG. 4 is a more detailed diagram of the CMMD 134 of FIG. 3. CMMD 134 includes an input buffer 141, a fixed divide-by-two prescaler 142, a fixed divide-by-four prescaler 143, and seven divide-by-2/3 modulus divider stages (MDS) 144-150. CMMD 134 receives the frequency divider input signal SIN on differential input leads 141A and outputs the frequency divider output signal SOUT on differential output leads 150A. Differential input leads 141A of FIG. 4 correspond to node 137 in FIG. 3. A synchronizing output stage (see FIG. 8) is disposed between the O and OB output leads of the last MDS stage 150 and the differential output leads 150A of FIG. 4. Each MDS stage of FIG. 4 can divide by either two or three depending on the values of the modulus controls signals S and MC. The divisor value DV that the overall CMMD 134 divides by is determined by how the CMMD is configured and by the values of the seven ST modulus control signals ST[6:0]. How CMMD 134 is configured is determined by the values of the configuration signals C0, C1 and C2 are described below.

Figure 5:
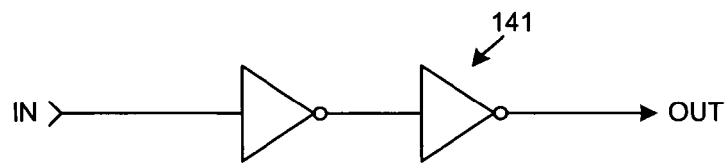
FIG. 5 is a diagram of the input buffer in the CMMD of FIG. 4.

FIG. 5 is a more detailed diagram of buffer 141 of FIG. 4.

Figure 6:
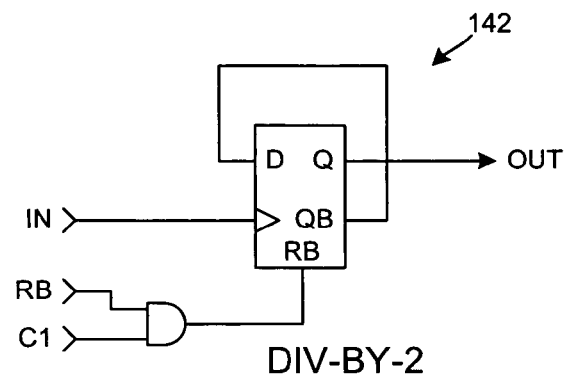
FIG. 6 is a diagram of the divide-by-two prescaler in the CMMD of FIG. 4.

FIG. 6 is a more detailed diagram of divide-by-two prescaler 142. Divide-by-two prescaler 142 is fixed in the sense that it is not programmable to divide by a selectable one of multiple divisors. Prescaler 142 is a single toggle flip-flop that has no power-consuming circuitry in the feedback loop from its QB output lead to its D input lead.

Figure 7:
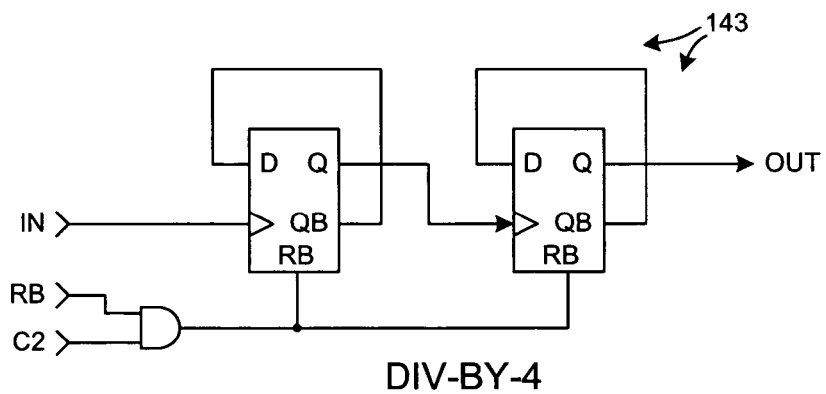
FIG. 7 is a diagram of the divide-by-four prescaler in the CMMD of FIG. 4.

FIG. 7 is a more detailed diagram of divide-by-four prescaler 143. Divide-by-four prescaler 143 is fixed in the sense that it is not programmable to divide by a selectable one of multiple divisors. Prescaler 143 is an asynchronous divider that includes two toggle flip-flops. Neither toggle flip-flop has any power-consuming circuitry in the feedback loop from its QB output lead to its D input lead.

Figure 8:
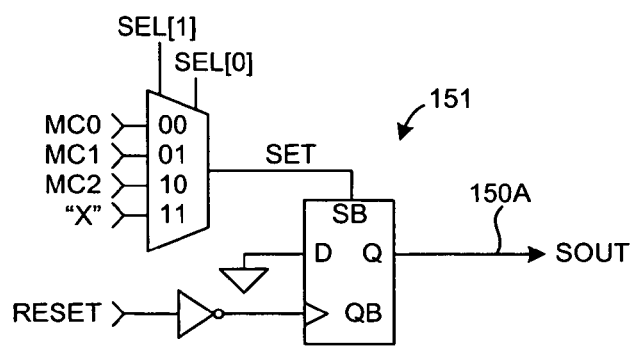
FIG. 8 is a diagram of the synchronizing output stage in the CMMD of FIG. 4. The synchronizing output stage reduces jitter in the output signal SOUT.

FIG. 8 is a diagram of synchronizing output stage 151 of the CMMD 134. Output stage 151 is not illustrated in FIG. 4 due to space limitations on the page. Output stage 151, however, reduces jitter in the output signal SOUT by synchronizing the output of the last MDS stage 150 with the input signal SIN (using MC0 or MC1 or MC2). The O output lead of the last MDS stage 150 is connected to the RESET input of output stage 151. Output stage 151 outputs the output signal SOUT that is output from the CMMD 134 on differential output leads 150A of FIG. 4. The circuits of FIGS. 5-8 are illustrated using conventional digital logic symbols whose signals are not differential signals. The actual circuits of FIGS. 5-8 are, however, realized using circuitry that employs differential signals. Only the output of output stage 151 is a single-ended output signal. This single-ended output signal SOUT is supplied onto output lead 138 in FIG. 3.

FIG. 9 is a table that sets forth the operation of control logic circuit 136 of FIG. 3. Control logic circuit 136 maps the S[7:0] values output from the adder 135 of FIG. 3 to the modulus control values ST[6:0]. As illustrated in FIG. 4, the ST[6:0] bit values are supplied to corresponding ones of the MDS stages of CMMD 134. As indicated in FIG. 9, control logic circuit 136 also generates the configuration signals C1, C2 and C3. How control logic circuit 136 generates the ST[6:0], C1, C2 and C3 values depends on the mode select value SEL[1:0]. The mode select value SEL[1:0] is a 2-bit input to the local oscillator 112 and is supplied by other circuitry to put the local oscillator into one of the GSM mode, the CDMA1X mode, or the WCDMA mode.

FIG. 10 is a table that sets forth the operation of shift right integer (SRI) circuit 132 of FIG. 3. As indicated in FIG. 3, eight of the output leads of the SRI circuit 132 are coupled to the eight corresponding input leads of the first digital input port 139 of adder 135. In the GSM mode, the SRI circuit 132 performs no shifting. In the CDMA1X mode, the SRI circuit 132 shifts one bit position to the right. In the WCDMA mode, the SRI circuit 132 shifts two bit positions to the right.

FIG. 11 is a table that sets forth the operation of shift right fractional (SRF) circuit 133 of FIG. 3. As indicated in FIG. 3, the twenty-two output leads of SRF circuit 133 are supplied to the sigma-delta modulator 131. In the GSM mode, the SRF circuit 133 performs no shifting. In the CDMA1X mode, the SRF circuit 133 shifts one bit position to the right. The least significant bit shifted out of SRI circuit 132 is shifted into SRF circuit 133 as the most significant bit FT[21]. In the WCDMA mode, the SRI circuit 132 shifts two bit positions to the right. The two least significant bits shifted out of SRI circuit 132 are shifted into SRF circuit 133 as the two most significant bits FT[21] and FT[20].

FIG. 12 is a more detailed diagram of one of the MDS stages 144-150 of the CMMD 134 of FIG. 4. The MDS stage can either divide by three or divide by two, depending on the values of the input control signals S and MCIN. Although the circuit of FIG. 12 is illustrated using conventional digital logic symbols whose signals are not differential signals, the MDS stage may be realized using differential logic (for example, current mode logic) and using differential signals.

GSM Mode Operation

When cellular telephone 100 is operating in the GSM mode, the mode select input values SEL[1] and SEL[0] are 0 and 0, respectively. As indicated by FIG. 9, when SEL[1] and SEL[0] are both zeros, then the GSM mode is selected and the control logic 136 causes C0=0, C1=0 and C2=0. As indicated by FIG. 4, configuration signal C0 is supplied to the C input lead of MDS stage 144, configuration signal C1 is supplied to the C input lead of MDS stage 145, and configuration signal C2 is supplied to the C input lead of MDS stage 146. As indicated by FIG. 12, when the signal on the C input lead of a MDS stage is a digital high, then the signal on the AUX input lead is used at the input signal to the MDS stage rather than the signal on the I input lead. When the signal on the C input lead of a MDS stage is a digital low, then the signal on the I input lead is used as the input signal to the MDS stage. Returning to FIG. 4, if C0, C1 and C2 are all zeros, then the signal path through the CMMD 134 is from the input leads 141A, through buffer 141, into the I input leads of MDS stage 144, through first MDS stage 144, into the I input leads of second MDS stage 145, through second MDS stage 145, and onward through MDS stages 146, 147, 148, 149 and 150, and then through output stage 151 (see FIG. 8). Output stage 151 synchronizes the output signal with MC0 or MC1 or MC2 and drives the output signal SOUT onto output lead 138 in FIG. 3. The CMMD 134 is therefore configured as a seven-stage multi-modulus divider. The divisor number by which a seven-stage multi-modulus divider divides is given by an equation.

FIG. 13 sets forth the equation that indicates what the value of S[6:0] should be in order for a seven-stage multi-modulus divider to divide by a desired divisor number.

In the GSM operating example of FIG. 3, an output signal of a frequency of 901 MHz is to be output to mixer 106 of FIG. 2. Because conditioning output divider 128 divides by four, the frequency of the signal SIN that is the signal input to CMMD 134 is 3.604 GHz. Because the crystal oscillator signal source 122 outputs a 20 MHz reference clock signal, the frequency of the signal SOUT that is output from CMMD 134 is 20 MHz. Frequency divider 129 therefore must divide by a divisor D of 180.2.

The digital equivalent of the decimal number 180 is [10110100]. This number [10110100] is supplied to the shift right integer (SRI) circuit 132 as indicated in FIG. 3. Because SEL[1] is zero and SEL[0] is zero, SRI circuit 132 performs no shifting as indicated by FIG. 10. The N[7:0] values on the inputs of SRI circuit 132 pass through the SRI circuit 132 unshifted and are presented onto the first input port 139 of adder 135 as the value NT[7:0].

FIGS. 14 and 15 set forth how the value F[21:0] that is supplied to shift right fractional (SRF) circuit 133 is determined. The fractional portion of the divisor D is set equal to X divided by $2^N$, wherein N is the number of bits in the sigma-delta modulator. In the present example, the sigma-delta modulator has twenty-two bits. FIG. 15 shows the result of solving for X. The integer portion of X is the value of F[21:0]. This integer portion is 838,860. The twenty-two bit binary equivalent of 838,860 is [00,1100110011001100] where the leftmost bit is the most significant bit. As indicated in FIG. 3, this value is supplied to SRF circuit 133 as the value F[21:0].

Because SEL[1] and SEL[0] are both zeros, the SRF circuit 133 performs no shifting as indicated by the table of FIG. 11. The value of F[21:0] is therefore passed through SRF circuit 133 unshifted and is presented to sigma-delta modulator 131 as twenty-two bit value FT[21:0]. The sigma-delta modulator 131 uses this value to vary the sigma-delta modulator output value SDM[3:0] that is supplied to the second digital input port 140 of adder 135.

Assume for the time being that SDM[3:0] is [0000]. The S[7:0] output from adder 135 is therefore [10110100] or a binary 180. Returning to the equation of FIG. 13, if the seven-stage multi-modulus divider within CMMD 134 is to divide by 180, then the equation of FIG. 13 indicates that the values of S[6:0] that are supplied to the MDS stages of the multi-modulus divider should be [0110100]. As indicated by the table of FIG. 9, control logic circuit 136 converts the S[7:0] value of 10110100 into the ST[6:0] value of 0110100. The CMMD 134 therefore divides the signal SIN by the divisor DV 180 to generate the output signal SOUT.

The sigma-delta modulator 131, however, varies the value SDM[3:0] over time so that the divisor DV is changed over time such that the overall divisor D of the frequency divider 129 is 180.2 as desired.

FIG. 16 is a waveform diagram showing signals within the CMMD 134 of FIG. 4. The signal VCO_BUF is the SIN input signal after it has passed through buffer 141. Waveform SOUT is the signal output from output stage 151. In the waveform, the frequency F1 of the input signal is 3.604 GHz, and the frequency divider 129 is set to divide by 180.2. The period between rising edge A and rising edge B of the output signal SOUT is 49.9445 nanoseconds. This period is called a "count cycle". Although not illustrated in FIG. 16, the frequency divider 129 goes through one count cycle after another. In the example of FIG. 16, FT[21:0] is zero. The waveform therefore represents a situation where the divisor D is 180 and not 180.2. Where the value of F[21:0] is set as indicated in FIG. 3, the value of SDM[3:0] to be used in the next upcoming count cycle is changed on the falling edge of SOUT. This allows enough time for propagation through adder 135 and control logic 136 before the beginning of the next count cycle. Where the value of DSM[3:0] is changed to [0001] on the falling edge of SOUT, for example, the frequency divider 129 in the next count cycle would divide by a divisor DV of 181. The divisor DV is changed over time under control of the sigma-delta modulator 131 such that the overall divisor D of the frequency modulator 129 is the desired 180.2 when operation of the frequency modulator is considered over a time period spanning multiple count cycles of the CMMD 134.

In this GSM mode, note that buffer 141 and all five MDS stages 144-150 are being used. Because C1=0 and C2=0, the divide-by-two prescaler 142 and the divide-by-four prescaler 143 are disabled and are not consuming power.

CDMA1X Mode Operation

Figure 17:
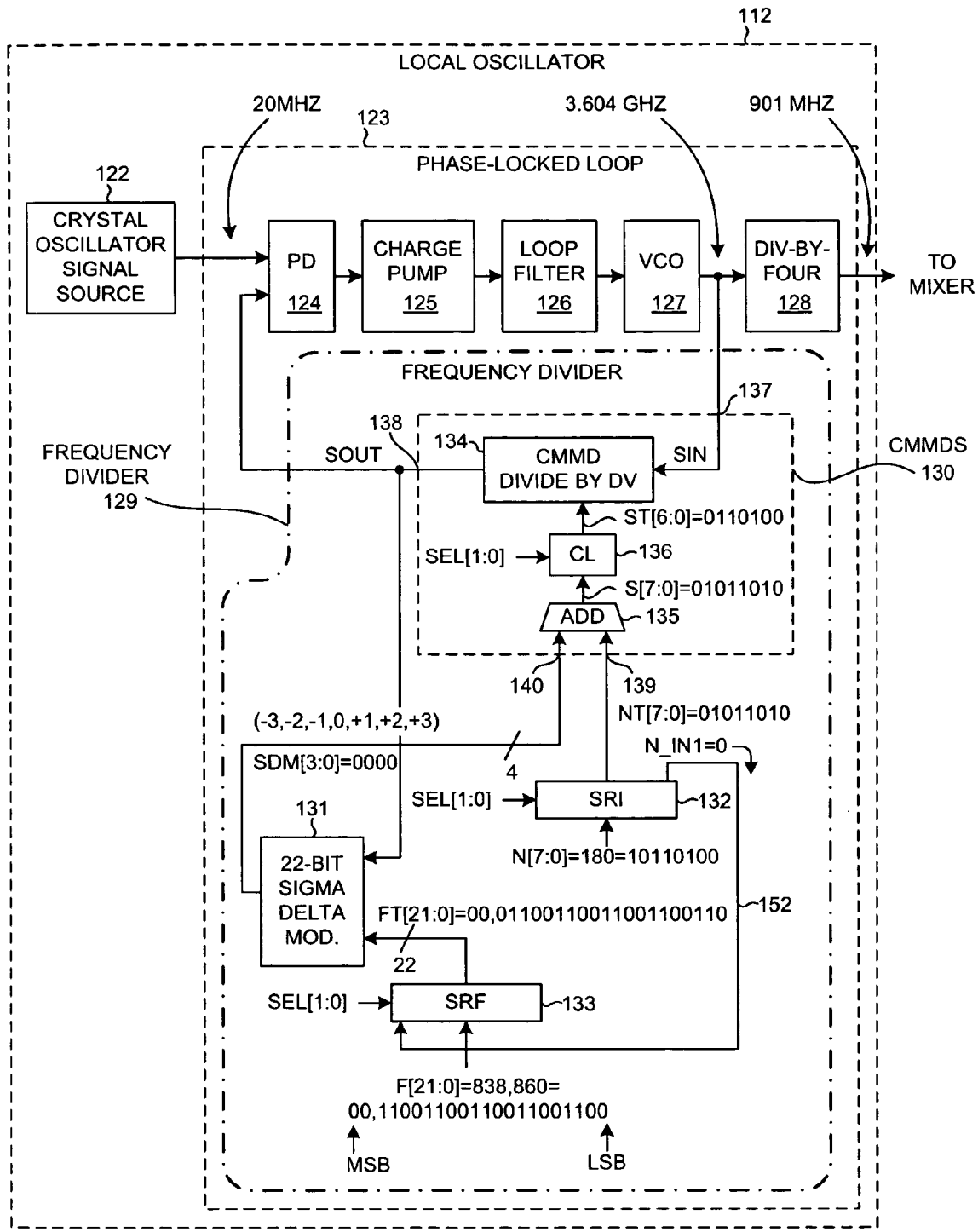
FIGS. 17 and 18 illustrate operation of a local oscillator in the mobile communication device of FIG. 1 when the mobile communication device is operating in the CDMA1X mode.
Figure 18:
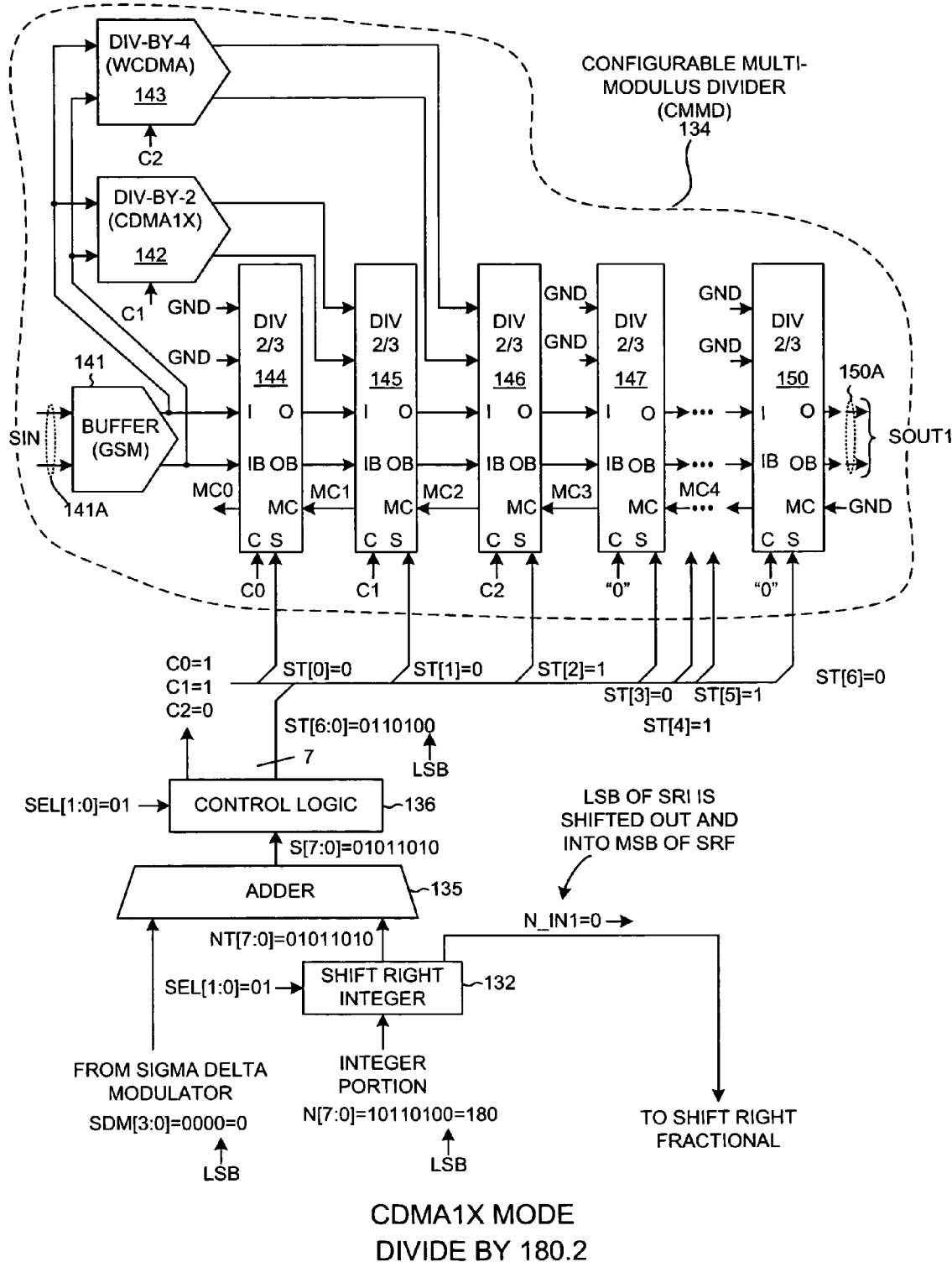

Operation in the CDMA1X mode is set forth in FIGS. 17 and 18. The example set forth is an example where the frequency divider 129 is to divide by 180.2 as in the GSM example above. When cellular telephone 100 is to operate in the CDMA1X mode, the mode select input values SEL[1] and SEL[0] are 0 and 1, respectively. As indicated by FIG. 9, when SEL[1] and SEL[0] are 0 and 1, then the CDMA1X mode is selected and C0=1, C1=1 and C2=0. As indicated by FIG. 18, configuration signal C0 is supplied to the C input lead of MDS stage 144, configuration signal C1 is supplied to the C input lead of MDS stage 145, and configuration signal C2 is supplied to the C input lead of MDS stage 146. Because C0=1, the signal on the AUX input lead of first MDS stage 144 is used as the input to first MDS stage 144. The AUX input leads are grounded as indicated by the "GND" on the AUX input leads in FIG. 18. This disables the first MDS stage 144 from switching and consuming power.

Figure 19:
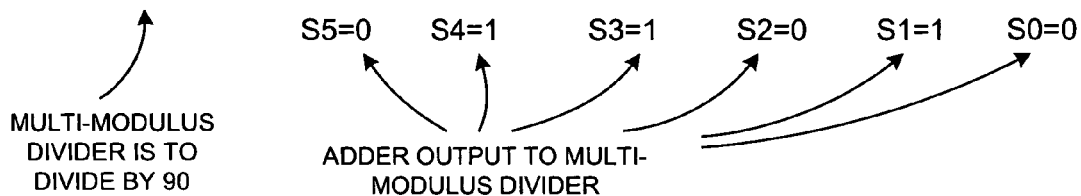
FIG. 19 sets forth an equation that indicates what the S[5:0] value should be in order for a six-stage multi-modulus divider to divide by a desired divisor number in CDMA1X mode.

As indicated by FIG. 18, configuration signal C1 is supplied to the C input lead of second MDS stage 145 and also to the enable input lead of divide-by-two prescaler 142. Configuration signal C1 being a digital high causes divide-by-two prescaler 142 to be enabled, and causes the second MDS stage 145 to receive the signal output from the divide-by-two prescaler 142 onto its AUX input leads. Configuration signal C2 being a low causes the divide-by-four prescaler 143 to be disabled, and causes the third MDS stage 146 to receive its input signal from the output of the second MDS stage 145. Accordingly, the signal path through the CMMD 134 is from the input leads 149, through buffer 141, through divide-by-two prescaler 142, into the AUX input leads of the second MDS stage 145, through the second MDS stage 145, into the I input leads of the third MDS stage 146, through the third MDS stage 146, and onward through MDS stages 147-150, and then through synchronizing output stage 151 (see FIG. 8). The CMMD 134 is therefore configured as divide-by-two prescaler, followed by a six-stage multi-modulus divider. The divisor number by which a six-stage multi-modulus divider divides is given by the equation of FIG. 19.

As indicated in FIG. 17, the integer portion of the desired divisor D value of 180.2 is supplied to the SRI circuit 132. The integer portion is 180. The binary equivalent of a decimal 180 is [10110100]. The fractional portion of the desired divisor D value of 180.2 is 0.2. As explained above in connection with the GSM example, the equations of FIGS. 14 and 15 are employed to determine the FT[21:0] value that is to be supplied to the SRF circuit 133. As in the GSM example above, the fractional portion is 0.2. The same binary [0011001100110011001100] is supplied to SRF circuit 133 as the value F[21:0].

The operations of SRI circuit 132 and SRF circuit 133 in the CDMA1X mode are set forth in FIGS. 10 and 11. Note that both circuits shift their inputs to the right one bit position. The least significant bit (LSB) that is shifted out of SRI circuit 132 is supplied via line 152 as a shift input bit that shifts into SRF circuit 133 to be FT[21]. The process of right shifting the composite divisor value (the integer portion supplied to SRI circuit 132 and the fractional portion supplied to SRF portion 133) effectively divides the divisor number by two. The adder 135 adds the right shifted integer portion and the SDM[3:0] output from the sigma-delta modulator 131. The resulting sum S[7:0] is converted by control logic circuit 136 in accordance with the equation of FIG. 19 into modulus control signals ST[6:0] as if the six-stage multi-modulus divider (in the CDMA1X mode the MDS stages of the CMMD 134 are configured into a six-stage multi-modulus divider) were being used to divide by half of the desired divisor value DV. The overall divisor value DV of the CMMD 134 is not, however, half a big as it should be. The overall divisor value DV of the CMMD 134 is correct due to the operation of the divide-by-two prescaler 142. CMMD 134 therefore divides by 180.2 as desired.

Whereas in the GSM mode a seven-stage multi-modulus divider was used without any prescaler, in the CDMA1X mode a six-stage multi-modulus divider is used with an additional divide-by-two prescaler. In both the GSM mode and the CDMA1X modes, the frequency divider 129 divides by a divisor D value of 180.2.

FIG. 20 is a waveform diagram that illustrates operation in the CDMA1X mode. In the example, the divisor D is 180. The fractional portion of the divisor D is zero. FT[21:0] is therefore zero. Signal SOUT is the output signal of the frequency divider 129. The period between rising edge A and rising edge B of output signal SOUT is 49.9445 nanoseconds. This period is called a "count cycle". The frequency F1 of the input signal SIN is 180 times the frequency F2 of the output signal SOUT. The frequency divider 129 therefore is dividing the input signal SIN by 180 as desired. Where the frequency divider 129 is to divide by a divisor D of 180.2, then the sigma-delta modulator 131 would change the SDM[3:0] from count cycle to count cycle so that the divisor DV that CMMD 134 divides by is changed from count cycle to count cycle. Over a plurality of such count cycles, the average of the divisor values DV is the divisor value 180.2. As explained above in connection with FIG. 16, the DSM value to be used in the next upcoming count cycle is changed on the falling edge of SOUT. This allows enough time for propagation through adder 135 and control logic 136 before the beginning of the next count cycle.

WCDMA Mode Operation

When cellular telephone 100 is to operate in the WCDMA mode, the mode select input values SEL[1] and SEL[0] are 1 and 0, respectively. As indicated by FIG. 9, when SEL[1] and SEL[0] are 1 and 0, then the WCDMA mode is selected and C0=1, C1=0 and C2=1. The first MDS stage 144 is disabled because C0 is a digital high, thereby causing first MDS stage 144 to receive its input signal from the grounded upper AUX input leads. C1 being a digital low disables divide-by-two prescaler 142. The second MDS stage 145 is also disabled because C1 is a digital low. Because a digital low is on the C input of second MDS stage 145, second MDS stage 145 selects its lower I input leads as the source of the input signal. The signal on the I input lead of second MDS stage 145 is not switching because the output O of the first MDS stage 144 is not switching due to C0 being a digital high. The O output from the second MDS stage 145 is therefore also not switching. Because C2=1, divide-by-four prescaler 143 is enabled. Because C2=1, third MDS stage 145 selects the AUX input leads as its input signal source. The path through the CMMD 134 is therefore from SIN input leads 141A, through buffer 141, through divide-by-four prescaler 143, into the AUX input leads of third MDS stage 146, through third MDS stage 146 and then through the fourth, fifth, sixth, seventh MDS stages 147 thru 150, and out through synchronizer 151 and onto output 150A. The CMMD 134 is therefore configured as a divide-by-four prescaler followed by a five-stage multi-modulus divider. The first two MDS stages and the divide-by-two prescaler are not switching and are therefore in a low-power operating condition.

Whereas in the CDMA1X mode the SRI and SRF circuits 132 and 133 right shifted the divisor value D one bit position to the right, in the WCDMA mode the SRI and SRF circuits 132 and 133 right shift the divisor value D two bit positions to the right. This effectively divides the divisor value D by four. Control logic 136 converts the output S[7:0] of adder 135 into a value ST[6:0] in accordance with the equation for a five-stage multi-modulus divider so that the five-stage multi-modulus divider in the CMMD will divide by the divisor value divided by four. The overall divisor value DV of CMMD 134, however, is the correct divisor value D due to the preceding divide-by-four prescaler 143. The sigma-delta modulator 131 varies the value on the second digital input port 140 of adder 135 such that the divisor value DV that CMMD 134 divides by is changed from count cycle to count cycle. The value on the second digital input port 140 is varied such that over time the average overall divisor value D of the frequency divider 129 is the desired 180.2 when frequency divider operation is considered over a time period spanning multiple count cycles.

Figure 21:
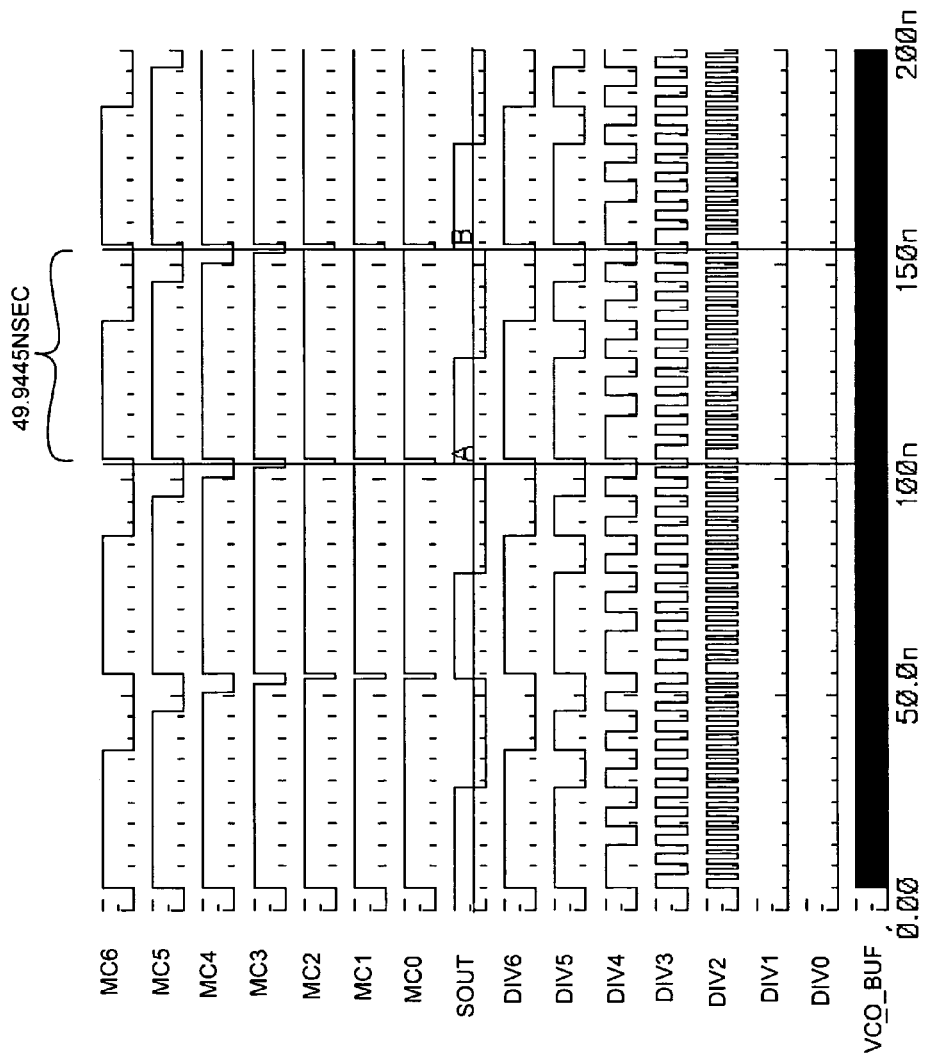
FIG. 21 is a waveform diagram showing signals within the CMMD of the frequency divider in local oscillator 112 of the mobile communication device of FIG. 1 when the mobile communication device of FIG. 1 is operating in the WCDMA mode.

FIG. 21 is a waveform diagram that illustrates operation of frequency divider 129 in the WCDMA mode. The frequency divider 129 is dividing a 3.604 GHz input signal by a divisor of 180. The waveform VCO_BUF is a waveform of the frequency divider input signal SIN after it has passed through buffer 141. The waveform labeled SOUT is a waveform of the frequency divider output signal.

Flowchart

Figure 22:
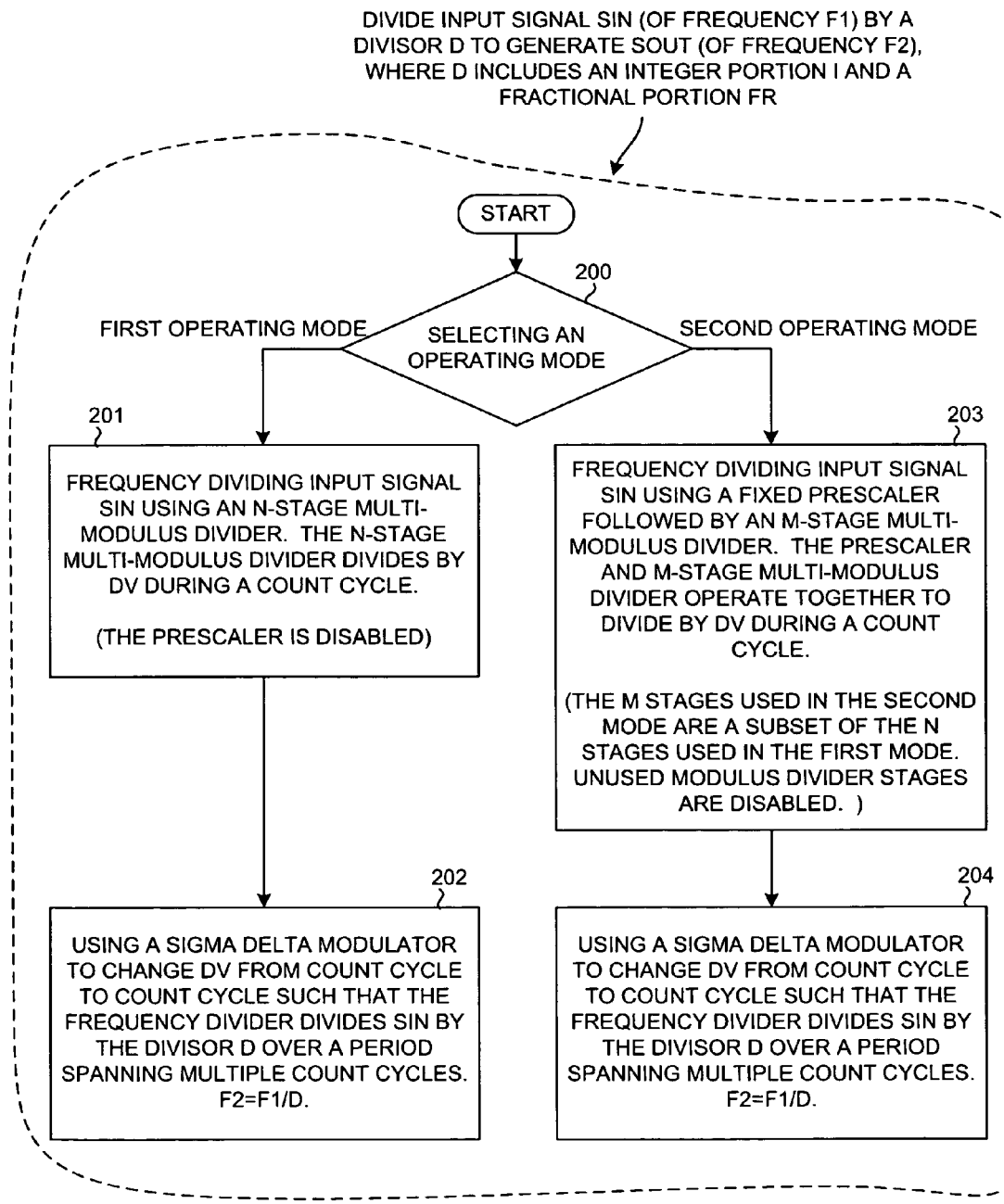
FIG. 22 is a flowchart of a method in accordance with one novel aspect.

FIG. 22 is a flowchart that illustrates a method of operation of the novel frequency divider 129 of FIG. 3. Frequency divider divides the frequency divider input signal SIN (of frequency F1) by a divisor D to generate the frequency divider output signal SOUT (of frequency F2), where divisor D includes an integer portion I and a fractional portion FR. $F2=F1/D$. In the example of FIGS. 3, 4, 17 and 18 set forth above, the integer portion I is 180 and the fractional portion FR is 0.2. The divisor D is 180.2.

In FIG. 22, decision block 200 represents the step of selecting a first operating mode (for example, the GSM operating mode) or a second operating mode (for example, the CDMA1X operating mode). If frequency divider 129 is to operate in the first operating mode, then the steps of blocks 201-202 are performed. If the frequency divider 129 is to operate in the second operating mode, then the steps of blocks 203-204 are performed.

If the first operating mode is selected, then the configurable multi-modulus divider (CMMD) structure 134 of FIG. 4 is configured as an N-stage multi-modulus divider. The frequency divider 129 frequency divides (step 201) the input signal SIN using the N-stage multi-modulus divider. N in this case is seven. The path through the CMMD is through buffer 141, through MDS 144, then through MDS 145 and so forth through MDS stages 146-150, through output synchronizer 151, and onto the output lead of the frequency divider. During a count cycle, the seven-stage MMD divides by a first number. There is no prescaler in the signal path in the CMMD, so the first number is the divisor DV that the CMMD structure 134 divides by. The first number is determined by supplying the integer portion I onto the first port 139 of adder 135 and by supplying the sigma-delta output (SDM[3:0]) onto the second port 140 of adder 135. The integer value I in this instance is supplied to the adder through SRI circuit 132. The sigma-delta modulator 131 controls (step 202) sigma-delta output SDM[3.0] such that over a time period spanning multiple count cycles, the frequency F2 of the frequency divider output signal SOUT is F1/D.

For an example of a configuration where N is seven, see FIGS. 3 and 4 above and the corresponding description of operation in the GSM mode.

If the second operating mode is selected, then CMMD structure 134 of FIG. 4 is configured as a fixed prescaler followed by an M-stage multi-modulus divider. The frequency divider 129 frequency divides (step 203) the input signal SIN using the prescaler and the M-stage multi-modulus divider. In the example of FIG. 4, the fixed prescaler is a divide-by-two prescaler and M is six. The signal path through the CMMD of FIG. 4 is through buffer 141, through divide-by-two prescaler 142, through MDS stage 145, and on through the remainder of the MDS stages 146-150. The six-stage multi-modulus divider divides by a second number. The second number is determined by shifting the integer portion I one bit to the right to generate a shifted value. In the example of FIG. 17, this shifting is performed by SRI circuit 132. The shifted value NT[7:0] is supplied to the first input port 139 of adder 135, whereas the output of the sigma-delta modulator (SDM[3:0]) is supplied to the second input port 140 of adder 135. Adder 135 generates the second number s[7:0] which is converted by control logic 136 into modulus control signals ST[6:0] that control the M-stage multi-modulus divider to divide by the second number. The sigma-delta modulator 131 controls (step 204) sigma-delta output SDM[3:0] such that over a time period spanning multiple count cycles, the frequency F2 of the frequency divider output signal SOUT is F1/D.

For an example of a configuration where the prescaler is a fixed divide-by-two prescaler and M is six, see FIGS. 17 and 18 and the corresponding description of operation in the CDMA1X mode. For an example of a configuration where the prescaler is a fixed divide-by-four prescaler and M is five, see the description above of operation in the WCDMA mode.

Although the blocks of the method of FIG. 22 are illustrated in a flow, it will be understood that the actions set forth in blocks 201 and 202 overlap one another in time and that the actions set forth in blocks 203 and 204 overlap on another in time. The actions are separated from one another and are set forth in different blocks in the flowchart in order to clarify the various actions and to simplify the explanation of the overall method.

Jitter and Power Consumption

Note that in the GSM mode, the prescalers and MDS stages of CMMD 134 are configured to form a seven-stage multi-modulus divider. In the CDMA1X mode, the prescalers and MDS stages of CMMD 134 are configured to form a divide-by-two prescaler followed by a six-stage multi-modulus divider. The two configurations differ as to whether the first stage of the divider is a fixed prescaler of the architecture of FIG. 6, or whether the first stage of the divider is a MDS stage of the architecture of FIG. 12. The fixed prescaler architecture is a more asynchronous structure than the MDS stage architecture. Note that in the MDS stage of FIG. 12, there are two flip-flops 153 and 154 that are clocked by a common signal. If the MDS stage is the first stage in a divider, then both flip-flops will be clocked at the high frequency of the input signal being divided. In comparison, if the asynchronous structure of FIG. 6 is used at the first stage of a divider, then only the first flip-flop in the first asynchronous prescaler will be clocked at the high frequency of the input signal being divided. Moreover, there is feedback logic in the MDS stage structure of FIG. 12 in the form of gates 155-158. When these gates switch, power is consumed. There are no such gates in the asynchronous structure of FIG. 6. For these reasons, using the asynchronous structure of FIG. 6 for the first stage of a divider results in lower power consumption in comparison to using the MDS stage structure of FIG. 12 as the first stage.

Although the asynchronous fixed prescaler structure of FIG. 6 is a lower power structure than the more synchronous MDS stage structure of FIG. 12, using the asynchronous structure as the first stage in a divider generally introduces more jitter into the output signal SOUT. This jitter is the variability in an edge of the output signal SOUT from count cycle to count cycle with respect to a reference edge of the input signal SIN. Using a fixed prescaler followed by a six-stage multi-modulus divider introduces more jitter into the output signal SOUT than using a seven-stage multi-modulus divider structure. The lower power asynchronous structure therefore has the drawback of introducing more jitter into the output signal.

In accordance with one novel aspect, it is recognized that different cellular telephone standards have different spurious noise and frequency resolution (related to phase noise) requirements. These requirements are collectively referred to here as "noise requirements". For example, the GSM standard has the most stringent noise requirements, followed by the CDMA1X standard, followed by the WCDMA standard. The jitter discussed above is noise introduced by the local oscillator. Accordingly, the different cellular telephone standards impose different maximum allowable jitter requirements on the local oscillators in the receive and transmit signal chains. The WCDMA standard allows the most jitter in the local oscillator output. The CDMA1X standard allows the next highest amount of jitter in the local oscillator output. The GSM standard tolerates the least amount of jitter in the local oscillator output. Configuring CMMD 134 to be a divide-by-four fixed prescaler followed by a five-stage multi-modulus divider (as in the WCDMA mode described above) satisfies the noise requirements imposed on local oscillators 112 and 119 for the WCDMA standard, but does not satisfy the noise requirements imposed on local oscillators 112 and 119 for the WCDMA1X standard. Configuring CMMD 134 to be a divide-by-two fixed prescaler followed by a six-stage multi-modulus divider (as in the CDMA1X mode described above), however, does satisfy the noise requirements imposed on local oscillators 112 and 119 for the CDMA1X standard. Accordingly, when the cellular telephone 100 is operating in the WCDMA mode, the SEL[1:0] are driven with the digital values 1 and 0, respectively. When the cellular telephone 100 is operating in the CDMA1X mode, on the other hand, the SEL[1:0] signals are driven with the digital values 0 and 1, respectively. In similar fashion, configuring CMMD 134 to be a divide-by-two prescaler followed by a six-stage multi-modulus divider does not satisfy the noise requirements imposed on local oscillators 112 and 119 by the GSM standard, but configuring CMMD 134 to be a seven-stage multi-modulus divider does satisfy the GMS noise requirements. Accordingly, when cellular telephone 100 is operating in the GSM mode, the SEL[1:0] signals are driven with the digital values 0 and 0, respectively. By using the lowest power configuration that satisfies the noise requirements of the standard being used, power consumption of the cellular telephone is reduced.

FIG. 23 is a table that compares the performance of a conventional multi-modulus divider within a local oscillator to the performance of the novel configurable multi-modulus divider (CMMD) of FIG. 3 within a local oscillator. Divider performance (noisiness and power consumption) in each of the GSM, CDMA1X and WCDMA modes is set forth in the table.

Figure 24:
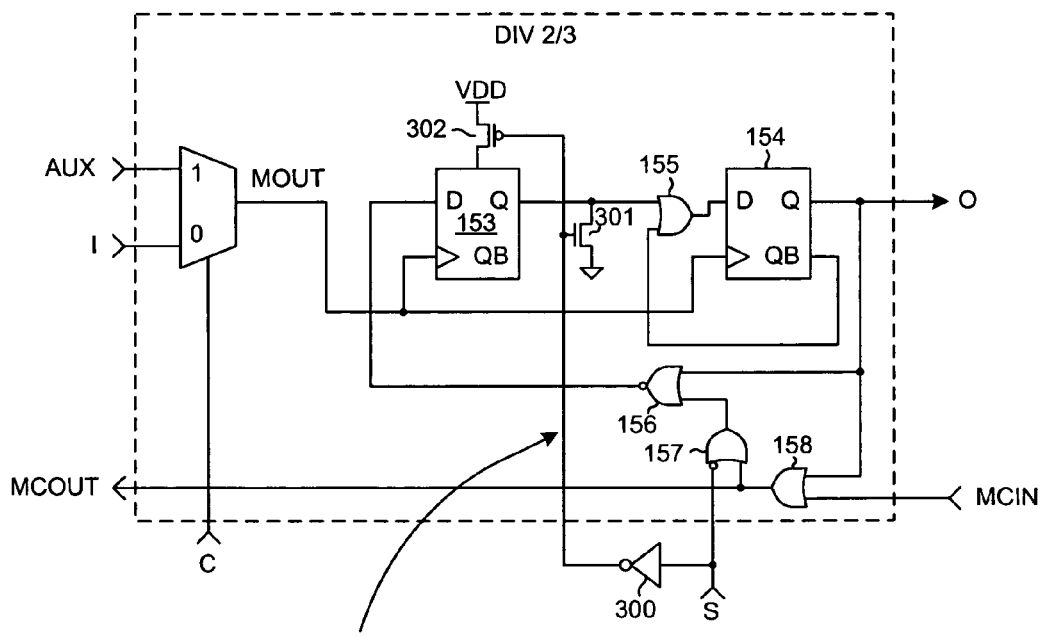
FIG. 24 is a schematic diagram that illustrates a method and circuit for reducing power consumption of MDS stages within the novel configurable multi-modulus divider (CMMD).

FIG. 24 is a schematic diagram that illustrates a method and circuit for reducing power consumption even further. As explained above in connection with FIG. 12, the modulus divider stage (MDS) can either divide an input signal by two or by three. If S=1, then the MDS stage is set to divide by three and both flip-flops 153 and 154 are used. If, however, S=0, then the MDS stage is set to divide by two. The first flip-flop 153 is not used, but rather the QB output of the second flip-flop 154 is coupled back to the D input of flip-flop 154 through OR gate 155 so that the second flip-flop 154 operates as a toggle flip-flop. When the MDS stage is operating to divide by two, the first flip-flop 153 in FIG. 12 is consuming power. It is supplied with supply power (by connections not shown) and its clock input lead is receiving the input clock signal. In one novel aspect, when the MDS stage (see FIG. 24) is set to divide by two, power to the first flip-flop 153 is cut. To prevent the voltage on the top input lead of OR gate 155 from floating when first flip-flop 153 is unpowered, the node coupled to the top input lead of OR gate 155 is coupled to ground potential. In one illustrative example, an inverter 300 and an N-channel pulldown transistor 301 are provided. When S=0 (the MDS is set to divide-by-two), inverter 300 outputs a digital high that turns transistor 301 on, thereby coupling the top input lead of OR gate 155 to ground. The signal output by inverter 300 also controls the P-channel transistor 302 through which first flip-flop 153 is coupled to the VDD supply conductor. When inverter 300 outputs a digital high signal, then transistor 302 is made non-conductive, thereby cutting power to first flip-flop 153 and preventing first flip-flop 153 from consuming power. When the MDS stage is set to divide-by-three, on the other hand, then transistor 302 is conductive and transistor 301 is non-conductive. Flip-flop 153 is powered and operational, and its Q output drives the top input lead of OR gate 155. Where the MDS stage of FIG. 24 is employed for the MDS stages in the novel frequency divider 129, a zero (a digital low) modulus control signal of ST[6:0] will cause the first flip-flop in its corresponding MDS stage in CMMD 134 to be unpowered, thereby reducing power consumption. To reduce power consumption still further, the first flip-flop may also be unpowered during a portion of the time the first flip-flop is not changing state when the MDS stage is dividing by three. Although the MDS stage of FIG. 24 is illustrated at the gate level with ordinary logic symbols to simplify the explanation of its operation, the logic of the MDS stage can be realized at the transistor level in various different ways. Techniques other than using a P-channel transistor to connect and disconnect flip-flop 153 from a VDD supply conductor can be employed. The MDS stage may be implemented in current mode logic (CML).

Although certain specific embodiments are described above for instructional purposes, the teachings of this patent document have general applicability and are not limited to the specific embodiments described above. Where the novel frequency divider is embodied in an integrated circuit within a mobile communication device, the frequency divider that is configurable into a selectable one of multiple operating modes may not actually be operated in one of the operating modes. For example, a first integrated circuit could be used in a cellular telephone that only communicates in accordance with a CDMA standard, whereas a second integrated circuit identical to the first integrated circuit could be used in another cellular telephone that only communicates in accordance with the GSM standard, whereas a third integrated circuit identical to the first integrated circuit could be used in yet a third cellular telephone that is capable of either CDMA or GSM communication. Although a frequency divider is described above where the same set of prescalers and modulus divider stages are configured in different ways in the different operating modes, a first prescaler and multi-modulus divider circuit can be used in a first operating mode and a second prescaler and multi-modulus divider circuit can be used in a second operating circuit such that there are no common prescalers or modulus divider stages in the first and second circuits. Parts of the frequency divider that operate at high frequency can be implemented using current mode logic whereas other parts of the frequency divider that operate at lower frequencies can be implemented using CMOS logic. Accordingly, various modifications, adaptations, and combinations of the various features of the described specific embodiments can be practiced without departing from the scope of the claims that are set forth below.

What is claimed is:

1. A method comprising:
   (a) selecting one of a first operating mode of a configurable frequency divider and a second operating mode of the configurable frequency divider, wherein the configurable frequency divider includes a prescaler and a plurality of modulus divider stages;
   (b) frequency dividing an input signal using an N-stage multi-modulus divider when the first operating mode was selected in (a), wherein the N-stage multi-modulus divider includes a number N of the plurality of modulus divider stages; and
   (c) frequency dividing the input signal using the prescaler and an M-stage multi-modulus divider when the second operating mode was selected in (a), wherein in the second operating mode the prescaler outputs a prescaler output signal such that the prescaler output signal is divided by the M-stage multi-modulus divider, wherein the M-stage multi-modulus divider includes a number M of modulus divider stages, wherein the M modulus divider stages are a subset of the N modulus divider stages.

2. The method of claim 1, wherein when the first operating mode was selected in (a) then the N-stage multi-modulus divider of (b) receives control signals that determine a divisor DV by which the N-stage multi-modulus divider divides in a count cycle of the N-stage multi-modulus divider, and wherein the frequency dividing of (b) includes using a sigma-delta modulator to change the control signals from count cycle to count cycle such that the N-stage multi-modulus divider divides by a divisor D over a period spanning multiple count cycles, wherein the divisor D includes an integer portion and a fractional portion.

3. The method of claim 1, wherein the prescaler divided by a single fixed divisor, wherein in the first operating mode the prescaler is disabled and does not perform a dividing function.

4. The method of claim 1, wherein one of the modulus divider stages of the N-stage multi-modulus divider is a first stage that receives the input signal, wherein the first stage is disabled and does not perform a dividing function when second operating mode was selected in (a).

5. The method of claim 1, wherein the configurable frequency divider is operable to frequency divide the input signal by a programmable divisor D to generate a frequency divider output signal regardless of whether the first operating mode or the second operating mode is selected in (a), wherein when the first operating mode is selected in (a) then the N-stage multi-modulus divider frequency divides in (b) by the programmable divisor D, wherein when the second operating mode is selected in (a) then the prescaler and the M-stage multi-modulus divider operate together to frequency divide in (c) by the programmable divisor D, wherein the programmable divisor D comprises a non-zero fractional portion.

6. A frequency divider, comprising:
   a prescaler; and
   a plurality of modulus divider stages, wherein the prescaler and the plurality of modulus divider stages are configurable in a first operating mode as an N-stage multi-modulus divider that divides an input signal and generates a frequency divider output signal, wherein the prescaler and the plurality of modulus divider stages are configurable in a second operating mode as a prescaler that divides the input signal to generate a prescaler output signal and an M-stage multi-modulus divider that divides prescaler output signal to generate the frequency divider output signal, wherein M is less than N.

7. The frequency divider of claim 6, wherein the frequency divider includes a pair of differential input leads, wherein the input signal in the first operating mode is present on the pair of differential input leads, and wherein the input signal in the second operating mode is present on the pair of differential input leads.

8. The frequency divider of claim 6, wherein the prescaler divided by a single fixed divisor, wherein in the first operating mode the prescaler is disabled and does not perform a dividing function.

9. The frequency divider of claim 6, wherein the prescaler is taken from the group consisting of: a single toggle flip-flop that dividing by two, a pair of toggle flip-flops that dividing by four.

10. The frequency divider of claim 6, wherein all the stages of the N-stage multi-modulus divider are stages of the plurality of modulus divider stages, and wherein all the stages of the M-stage multi-modulus divider are stages of the plurality of modulus divider stages.

11. The frequency divider of claim 9, wherein there is a stage of the N-stage multi-modulus divider that is not a stage of the M-stage multi-modulus divider in the second operating mode, wherein the stage includes a flip-flop, and wherein the flip-flop is not clocked in the second operating mode.

12. The frequency divider of claim 6, wherein the prescaler is disabled and prevented from dividing in the first operating mode.

13. The frequency divider of claim 6, wherein the N-stage multi-modulus divider receives a plurality control signals, the control signals determining a divisor DV by which the N-stage multi-modulus divider divides the input signal in a count cycle in the first operating mode to generate the frequency divider output signal, the frequency divider further comprising:
   circuitry that changes the control signals such that the divisor DV changes from count cycle to count cycle, wherein the divisor DV is changed from count cycle to count cycle such that the N-stage multi-modulus divider divides by a divisor D over multiple count cycles, the divisor D including an integer portion and a fractional portion.

14. The frequency divider of claim 13, wherein the circuitry that changes the control signals comprises a sigma-delta modulator.

15. The frequency divider of claim 6, further comprising:
   a synchronizing output stage that outputs the frequency divider output signal, wherein the synchronizing output stage is part of the N-stage multi-modulus divider in the first operating mode, and wherein the synchronizing output stage is part of the M-stage multi-modulus divider in the second operating mode.

16. The frequency divider of claim 6, wherein the frequency divider is a part of a mobile communication device, wherein the first operating mode is a mode in which the mobile communication device is adapted to communicate in accordance with a first cellular telephone communication standard, and wherein the second operating mode is a mode in which the mobile communication device is adapted to communicate in accordance with a second cellular telephone communication standard.

17. The frequency divider of claim 6, wherein the frequency divider is operable to divide the input signal by a divisor D to generate the frequency divider output signal in a selectable one of the first operating mode and the second operating mode, wherein the divisor D includes an integer portion and a fractional portion.

18. A method, comprising:
providing a frequency divider that is configurable in a first way in a first operating mode and that is configurable in a second way in a second operating mode, the frequency divider including a prescaler and a plurality of modulus divider stages, wherein when the frequency divider is configured in the first way then the prescaler and the plurality of modulus divider stages are configured to form an N-stage multi-modulus divider that divides an input signal on a frequency divider input lead and generates a frequency divider output signal, wherein when the frequency divider is configured in the first way then the prescaler does not perform a dividing function, wherein when the frequency divider is configured in the second way then the prescaler divides an input signal on the frequency divider input lead and generates a prescaler output signal, and wherein when the frequency divider is configured in the second way then plurality of modulus divider stages are configured to form an M-stage multi-modulus divider that divides the prescaler output signal and generates the frequency divider output signal, wherein M is less than N; and
configuring the frequency divider to operate in a selectable one of the first operating mode or the second operating mode.

19. A frequency divider, comprising:
a prescaler;
a plurality of modulus divider stages; and
means for configuring and controlling the prescaler and the plurality of modulus divider stages in a first operating mode such that the prescaler is disabled and such that a number N of the plurality of modulus divider stages form an N-stage multi-modulus divider that frequency divides a frequency divider input signal by a divisor D to generate a frequency divider output signal, and wherein the means is also for configuring and controlling the prescaler and the plurality of modulus divider stages in a second operating mode such that the prescaler frequency divides the frequency divider input signal and outputs a prescaler output signal and such that a number M of the plurality of modulus divider stages form an M-stage multi-modulus divider that frequency divides the prescaler output signal to generate the frequency divider output signal, wherein in the second operating mode the prescaler and the M-stage multi-modulus divider operate together to frequency divide the frequency divider input signal by the divisor D to generate the frequency divider output signal, wherein the M modulus divider stages are a subset of the N modulus divider stages.

20. The frequency divider of claim 19, wherein the means includes a sigma-delta modulator, wherein the divisor D include a non-zero fractional portion.

21. The frequency divider of claim 19, wherein the frequency divider is operable in the first operating mode but is not actually operated in the first operating mode, but rather is only operated in the second operating mode.

22. The frequency divider of claim 19, wherein the frequency divider is operable in the second operating mode but is not actually operated in the second operating mode, but rather is only operated in the first operating mode.

* * * * *